(12) United States Patent
Berge et al.

(10) Patent No.: US 10,349,532 B2
(45) Date of Patent: Jul. 9, 2019

(54) METHOD FOR IMPLEMENTING STUB-LESS PRINTED CIRCUIT BOARD VIAS

(71) Applicant: International Business Machines Corporation, Armonk, NY (US)

(72) Inventors: Layne A. Berge, Rochester, MN (US); John R. Dangler, Rochester, MN (US); Matthew S. Doyle, Chatfield, MN (US); Joseph Kuczynski, North Port, FL (US); Thomas W. Liang, Rochester, MN (US); Manuel Orozco, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 15/655,257

(22) Filed: Jul. 20, 2017

(65) Prior Publication Data

US 2019/0029123 A1  Jan. 24, 2019

(51) Int. Cl.
| | |
|---|---|
| *H05K 3/40* | (2006.01) |
| *H05K 1/11* | (2006.01) |
| *H05K 3/02* | (2006.01) |
| *B23K 26/00* | (2014.01) |
| *H05K 13/00* | (2006.01) |

(52) U.S. Cl.
CPC ........... *H05K 3/4084* (2013.01); *H05K 1/116* (2013.01); *H05K 3/027* (2013.01); *B23K 26/00* (2013.01); *H05K 13/00* (2013.01)

(58) Field of Classification Search
CPC ...... H05K 3/46; H05K 3/4602; H05K 3/4605; H05K 3/4608; H05K 3/4611; H05K 1/116; H05K 3/027; H05K 3/4084; H05K 13/00; B23K 26/00
See application file for complete search history.

(56) References Cited

U.S. PATENT DOCUMENTS

| | | | |
|---|---|---|---|
| 7,060,421 | B2 | 6/2006 | Naundorf et al. |
| 8,136,240 | B2 | 3/2012 | Kuczynski et al. |
| 8,230,592 | B2 | 7/2012 | Kuczynski et al. |
| 8,528,203 | B2 | 9/2013 | Balcome et al. |
| 8,965,159 | B1 | 2/2015 | Doyle et al. |
| 2006/0197092 | A1 | 9/2006 | Hoffman et al. |
| 2012/0074094 | A1 | 3/2012 | Chiang et al. |
| 2012/0312589 | A1 | 12/2012 | Balcome et al. |

FOREIGN PATENT DOCUMENTS

| | | | |
|---|---|---|---|
| CN | 130774123 B | | 11/2014 |
| JP | 02224398 A | * | 9/1990 |
| JP | 3180096 A | * | 8/1991 |
| WO | 1988004877 A1 | * | 6/1988 |

* cited by examiner

*Primary Examiner* — Carl J Arbes
(74) *Attorney, Agent, or Firm* — Joan Pennington

(57) ABSTRACT

A method and structure are provided for implementing stub-less printed circuit board (PCB) vias and custom interconnect through laser-excitation conductive track structures. Stub-less printed PCB vias are formed which terminate at desired signal layers by controlled laser excitation without stubs or the need to back-drill to remove such stubs.

12 Claims, 10 Drawing Sheets

METHOD FOR IMPLEMENTING STUB-LESS PRINTED CIRCUIT BOARD VIAS

FIELD OF THE INVENTION

The present invention relates generally to the data processing field, and more particularly, relates to a method and structures for implementing stub-less printed circuit board (PCB) vias and custom interconnect through laser-excitation conductive track structures.

DESCRIPTION OF THE RELATED ART

Many computer interfaces have sufficiently high switching speed that require signal routing layer change vias without stubs. PCB via stubs are extremely detrimental to channel margin.

Backdrilling is a conventional technique used to remove the via barrel stub. Without removal of the unnecessary section or length of a via barrel channel margin is reduced, some amount of the propagating signal is reflected away from the intended receiver, thereby significantly reducing the amount of total energy effectively transferred.

A need exists for a method and structure for implementing stub-less printed circuit board (PCB) vias creation and custom interconnect through laser-excitation conductive track structures, eliminating the need to back-drill, reducing PCB cost, and maximizing interface margin.

As used in the following description and claims, the term printed circuit board (PCB) should be understood to broadly include a printed wiring board or other substrate, an interconnect substrate, and various substrates including a plurality of insulator layers, and internal conductive traces.

SUMMARY OF THE INVENTION

Principal aspects of the present invention are to provide a method and structures for implementing stub-less printed circuit board (PCB) vias and custom interconnect through laser-excitation conductive track structures. Other important aspects of the present invention are to provide such method and structure substantially without negative effects and that overcome many of the disadvantages of prior art arrangements.

In brief, a method and structure are provided for implementing stub-less printed circuit board (PCB) vias and custom interconnect through laser-excitation conductive track structures. Stub-less printed PCB vias are formed which terminate at desired signal layers by controlled laser excitation, without stubs eliminating the need to back-drill to remove such stubs.

In accordance with features of the invention, custom termination resistances are formed through laser-excitation conductive track structures for multiple applications.

In accordance with features of the invention, the stub-less vias provide an electrical advantage through greater interface margin and typically increased operating speed.

In accordance with features of the invention, the stub-less vias provide a cost or financial benefit since the expensive post process back-drilling operation is not performed.

In accordance with features of the invention, eliminating back-drilling improves yield and late fail discoveries, both of which can improve cost and reliability of PCBs.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing stub-less printed circuit board (PCB) vias and custom interconnect through laser-excitation conductive track structures. Stub-less printed PCB vias are formed which terminate at desired signal layers by controlled laser excitation, without stubs or the need to back-drill to remove such stubs. The need to backdrill vias during printed circuit board (PCB) manufacturing is eliminated.

In accordance with features of the invention, the stub-less printed circuit board (PCB) vias provide both electrical and financial advantages.

In accordance with features of the invention, the stub-less vias provide greater interface margin and typically increased operating speed.

In accordance with features of the invention, the financial benefit results because the expensive post process back-drilling operation does not have to be performed.

Figure 1:
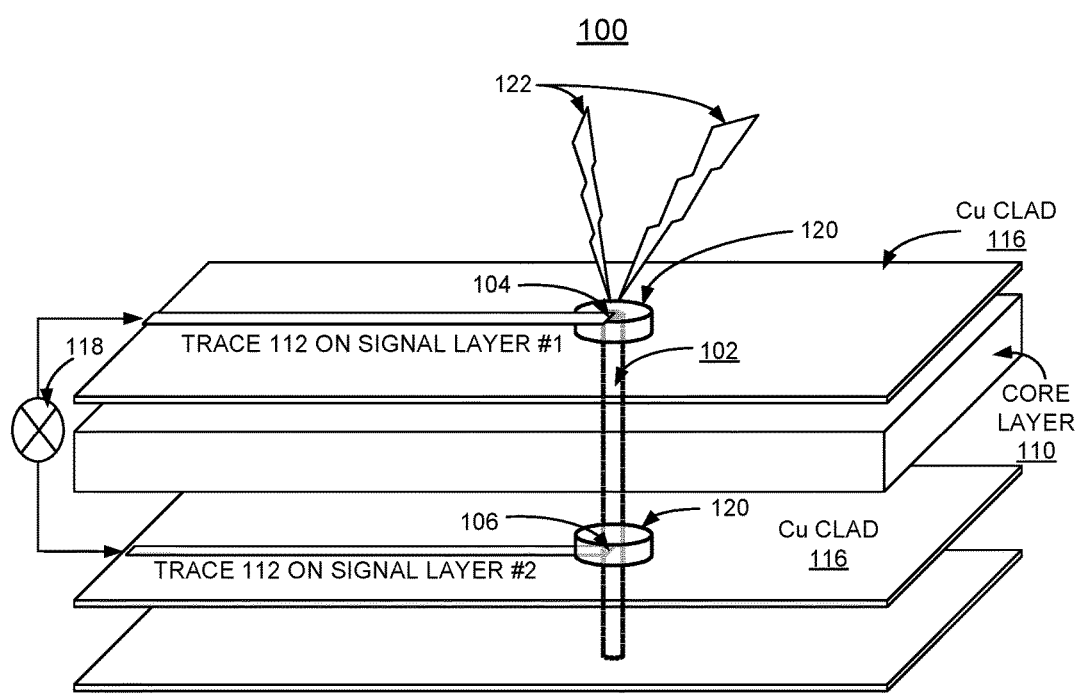
FIG. 1 illustrates an example structure for implementing enhanced stub-less via creation with both ends of a printed circuit board (PCB) signal trace being accessible, eliminating the need to back-drill in accordance with a preferred embodiment.

Having reference now to the drawings, in FIG. 1, there is shown an example structure generally designated by reference character 100 for implementing stub-less printed circuit board (PCB) vias and custom interconnect through laser-excitation conductive track structures, eliminating the need to back-drill in accordance with the preferred embodiment.

Structure 100 includes a printed circuit board (PCB) stub-less via 102 having both ends 104, 106 being accessible, and via 102 being stub-less eliminates the need to back-drill in accordance with a preferred embodiment. Structure 100 includes one or more PCB core layers 110 are comprised of laser-excited conductive track nuclei, and one or more internal PCB conductive traces 112 are disposed on a respective signal layer 116. PCB stub-less via 102 is created with both ends 104, 106 connected to respective printed circuit board (PCB) signal traces 112 that are accessible for connection to a DC resistance measurement device 118. Structure 100 includes a respective clearance hole 120 drilled into the etched Copper clad (cu-clad) signal layer 116. One or more laser excitation sources 122 are directed to the respective clearance hole 120.

U.S. Pat. No. 7,060,421 to Naundorf et al. issued Jun. 13, 2006 discloses conductive tracks disposed on an electrically non-conductive support material by depositing a metallized layer on metal nuclei produced by using electromagnetic radiation to break up electrically non-conductive metal compounds dispersed in the support material, and a method for producing them. The electrically non-conductive metal compounds are insoluble spinel-based inorganic oxides which are thermally stable and are stable in acidic or alkaline metallization baths, and which are higher oxides with a spinel structure, and which remain unchanged in non-irradiated areas. The spinel-based inorganic oxides used are heat resistant and remain stable after being subjected to soldering temperatures. The conductor tracks are reliably and easily produced and adhere strongly to the support. Classic spinels are mixed metal oxides of magnesium and aluminum, but the magnesium may be wholly or partially replaced by iron, zinc and/or manganese, and the aluminum by iron and/or chromium. Spinel-related mixed oxide structures also may contain nickel and/or cobalt cations. It may be advantageous if the spinel or spinel-related structure contains copper, chromium, iron, cobalt, nickel or a mixture of two or more of the foregoing. Copper may be particularly advantageous. Spinel-based thermally highly stable non-conductive higher oxides, which contain at least two different kinds of cations and which are stable and insoluble in aqueous acid or alkaline metallization baths, are mixed into the supporting material, the supporting material is processed into components or is applied to components as a coating and metal nuclei are released using electromagnetic radiation in the area of the conductor structures that are to be produced and these areas are then metallized by chemical reduction, the inorganic metal compound in the form of the spinel-based higher oxides can remain on the surface of the supporting material even in the non-irradiated areas. The inorganic higher oxides which contain at least two different kinds of cations used are furthermore sufficiently resistant to heat so that it is possible to use compounding or injection molding of modern high-temperature plastics. The spinel-based higher oxides remain stable even after exposure to soldering temperatures, i.e., they do not become electrically conductive and they remain stable in the metallization baths.

In accordance with features of the invention, stub-less printed PCB vias 102 are formed which terminate at desired signal layers by controlled laser excitation with one or more laser excitation sources 122. Conductive metal nuclei 102 is created through laser excitation of spinel through use of enabling art U.S. Pat. No. 7,060,421.

The subject matter of the above-identified U.S. Pat. No. 7,060,421 is incorporated herein by reference.

In accordance with features of the invention, laser excitation and conductive track creation is taught through the use of both resistance and time domain reflectometry (TDR) based control systems, for example, as shown in FIGS. 1-3, and FIGS. 4A, 4B, 5A, 5B.

Figure 6:
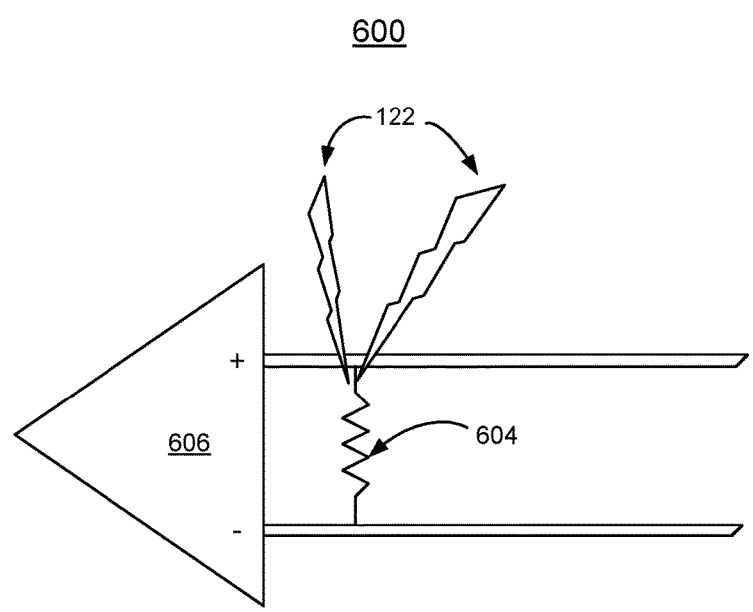
FIG. 6 illustrates an example structure for implementing a custom termination resistor with a differential pair in accordance with a preferred embodiment.
Figure 7:
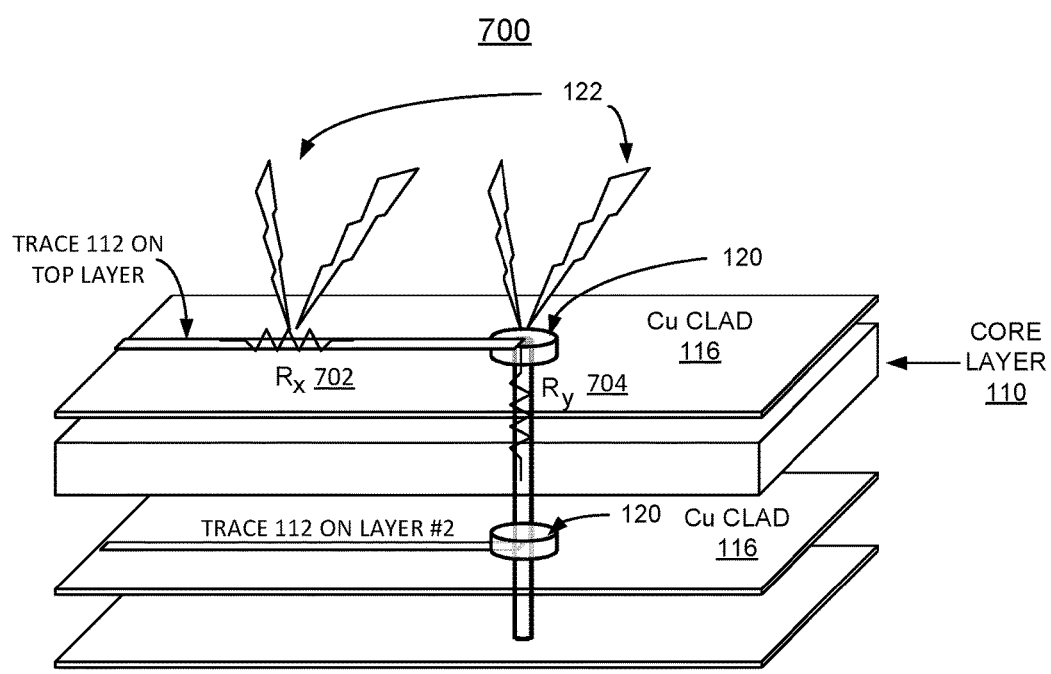
FIG. 7 illustrates another example structure for implementing custom termination resistors created vertically and horizontally and at interior printed circuit board (PCB) levels or on transmission lines in accordance with a preferred embodiment.
Figure 8:
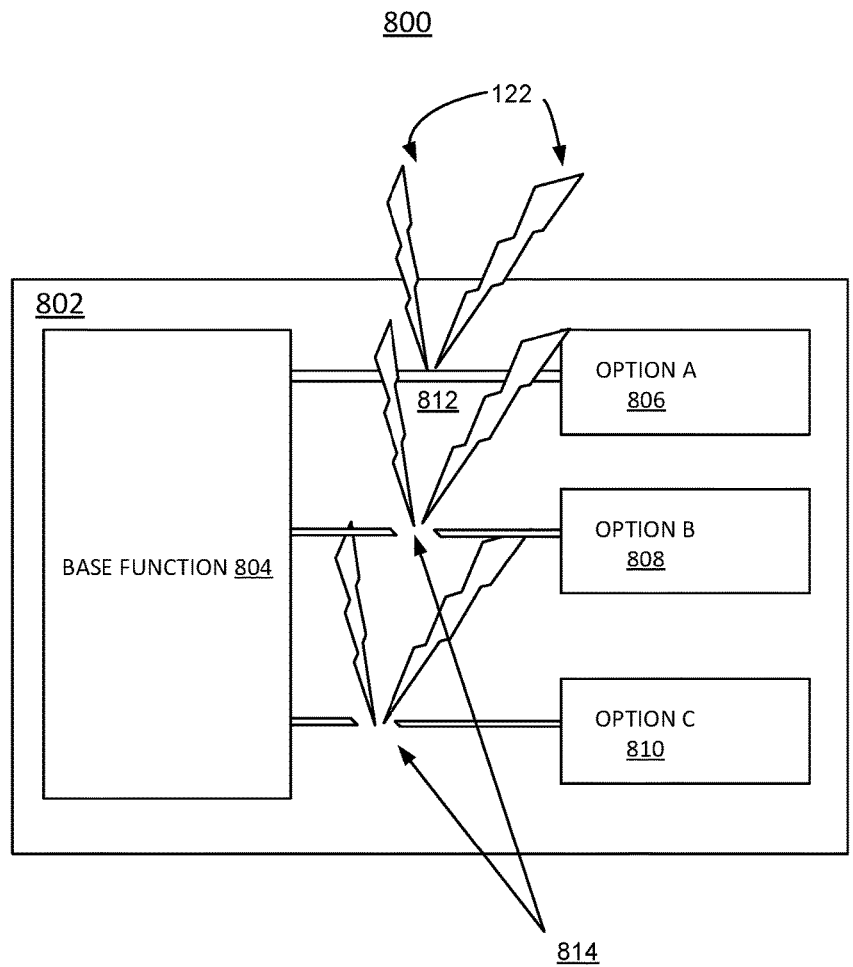
FIG. 8 illustrates another example structure for implementing custom options with conductive path creations in accordance with a preferred embodiment.

In accordance with features of the invention, in addition to stub-less PCB via creation, embodiments are included to teach custom termination resistances such as shown in FIGS. 6, and 7, and computer and server feature enablement without field replacement unit (FRU) upgrades such as shown in FIG. 8.

Structure 100 uses laser excitation renders conductive tracks, for example, using enabling art U.S. Pat. No. 7,060,421 which continues as long as the laser 122 is energized. The focal point of one or more laser beams of laser excitation sources 1-N, 122 aids in control of the depth of the conductive track which creates the stub-less via 102. For example, assume that for a given laser energy fluence or the amount of laser energy delivered in a single pulse expressed in joules/cm$^2$, 100 pulses may be needed to convert all of the spinel in conductive core layer 110 into conductive nuclei. This provides the user with control over the resistance of the resulting via 102 and other conductive track. Also to control the resistance is to adjust the loading level of the spine in conductive core layer 110, where the greater the concentration of the spinel, the greater the number of nuclei per pulse, the lower the resistance. The focal point of one or more laser beams combined with a measurement device 118 that measure DC resistance, renders the finished via 102. Additionally, this allows for subsequent plating process, if desired. Additionally, rastering a spiral path can be provided to create a custom inductance, if desired, in accordance with features of the invention.

Structure 100 is implemented using the resistance measurement of device 118 to monitor the depth of the conductive tracks in the via barrel until a predefined value has been reached. This process ensures the via stops at the trace termination layer 116, #2, without a stub.

In accordance with features of the invention, in the situation where more than one layer change is required to complete the net, the resistance measurement monitoring system is applied twice, once for the via between each of the n layer changes.

In FIGS. 1-3, FIGS. 4A, 4B, 5A, 5B, and FIGS. 6-8, the same reference characters are used for identical or similar components.

Figure 2:
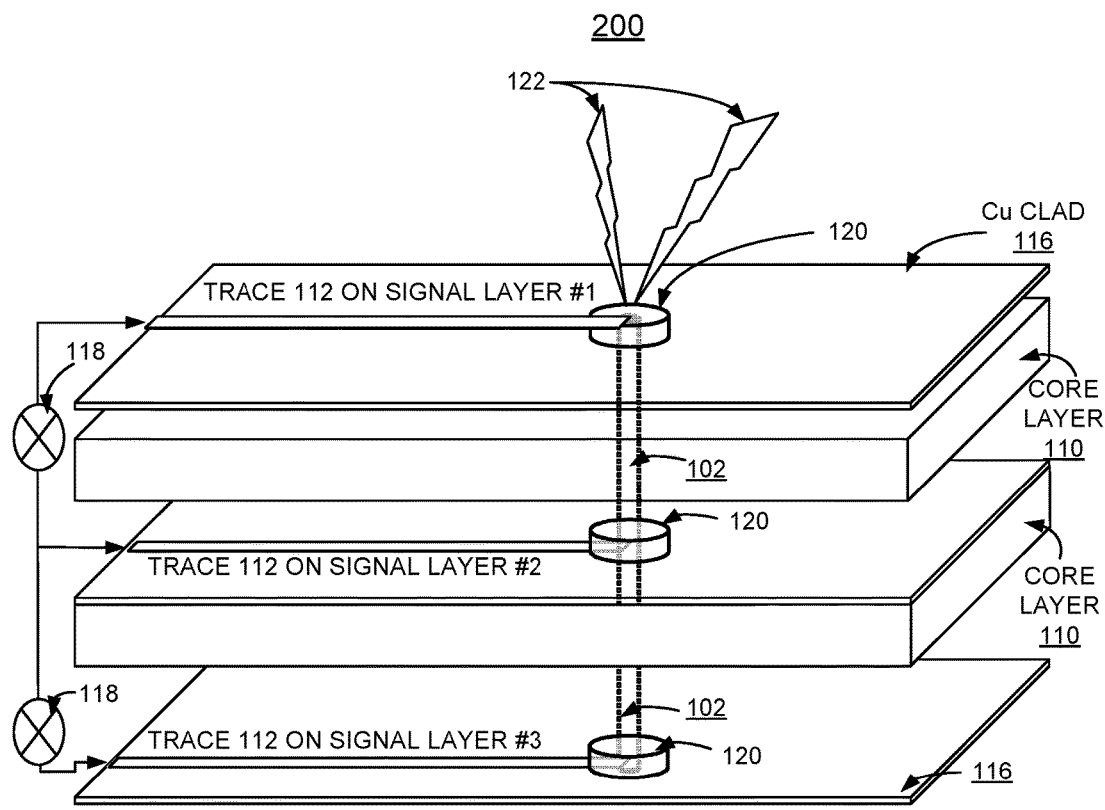
FIG. 2 illustrates an example structure for implementing enhanced stub-less via creation with more than one layer change is required to complete the net or a three printed circuit board (PCB) signal layer application, eliminating the need to back-drill in accordance with a preferred embodiment.

Referring now to FIG. 2, there is shown an example structure generally designated by reference character 200 for implementing enhanced stub-less via creation with more than one layer change is required to complete the net or a three printed circuit board (PCB) signal layer application, eliminating the need to back-drill in accordance with a preferred embodiment. Structure 200 includes a trace 112 on respective signal layers #1, #2, #3, 116 for connection to the PCB stub-less via 102 being created. As shown, where more than one layer change is required to complete the net, the resistance measurement monitoring system 118 is applied twice, once for the via 102 between each of the n layer changes #1, #2, #3, 116.

Figure 3:
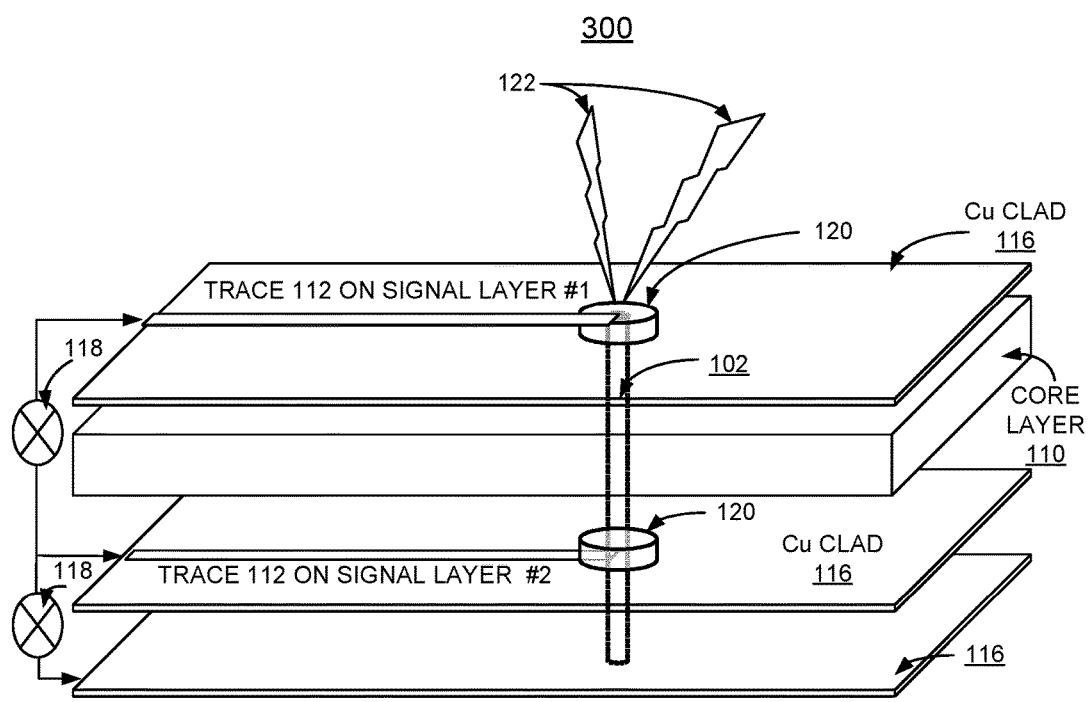
FIG. 3 illustrates an example structure for implementing enhanced stub-less via creation for a first path with both ends of a printed circuit board (PCB) signal trace being accessible, and a second path where continuity is not wanted, in accordance with a preferred embodiment.

Referring now to FIG. 3, there is shown an example structure generally designated by reference character 300 for implementing enhanced stub-less via creation for a first path with both ends of a printed circuit board (PCB) signal trace being accessible, and a second path where continuity is not wanted, in accordance with a preferred embodiment. Structure 300 illustrates resistance measurement 118 monitoring the depth of the conductive tracks 112, on layer #1, #2 in the via barrel until a predefined value has been reached, as also shown in FIG. 1. This process ensures the via 102 stops at the trace termination layer, without a stub.

Structure 300 illustrates one additional advantage which could be utilized as desired. Structure 300 illustrates in parallel with monitoring the resistance of the path wanted between conductive tracks 112, on layer #1, #2, resistance measurement 118 monitoring the resistance from the desired via or trace to an adjacent plane conductive track 112, on layer #2, and signal layer #3, 116 or pad where continuity is not wanted.

Figure 4A:
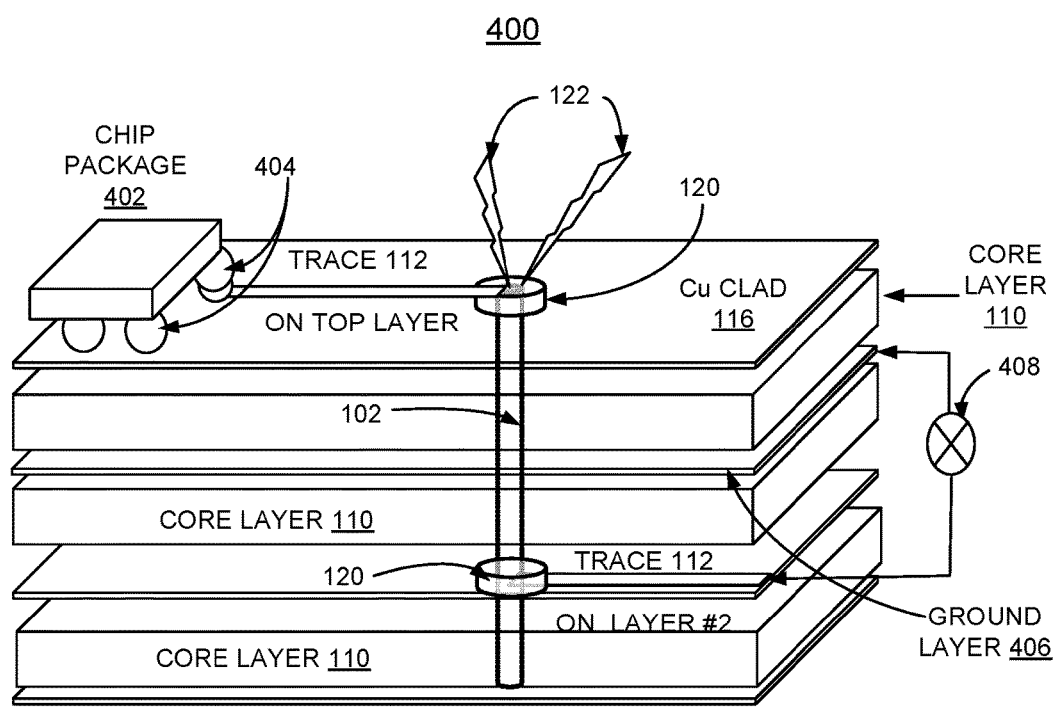
FIG. 4A illustrates an example structure for implementing enhanced stub-less via creation with one end of a printed circuit board (PCB) signal trace being blocked with a ball grid array blocking access to one end of a trace and the other end being accessible where time domain reflectometry (TDR) measurement device is used in accordance with a preferred embodiment.
Figure 4B:
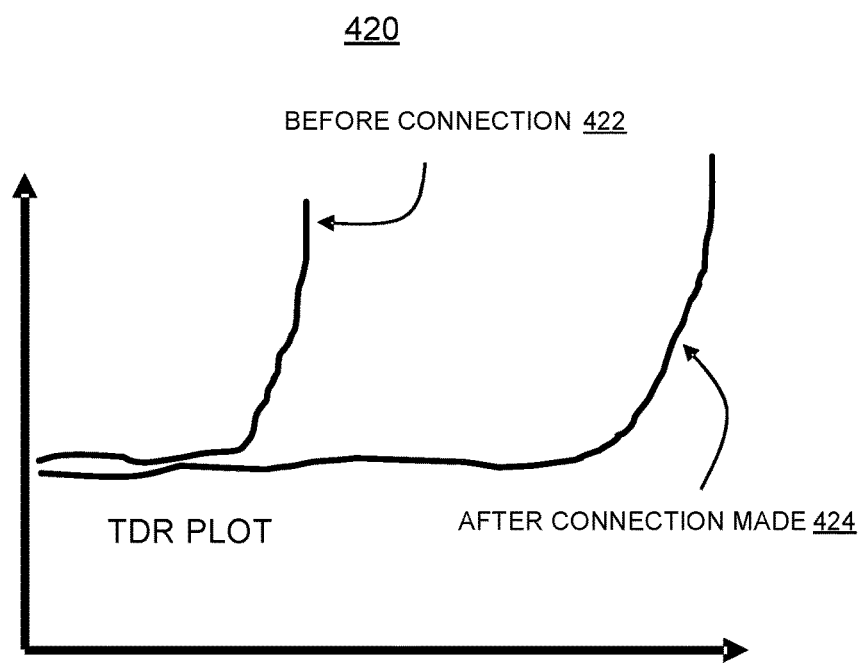
FIG. 4B illustrates time domain reflectometry (TDR) measurement plots for the example structure of FIG. 4A in accordance with a preferred embodiment.

Referring now to FIG. 4A, there is shown an example structure generally designated by reference character 400 for implementing enhanced stub-less via creation with one end of a printed circuit board (PCB) signal trace being blocked with a ball grid array blocking access to one end of a trace and the other end being accessible where time domain reflectometry (TDR) measurement device is used in accordance with a preferred embodiment. Structure 400 includes a trace 112 on a top signal layer 116, with a chip package 402 and ball grid array 404 blocking access to the trace on a top signal layer. A ground layer 406 below the trace 112 on a top signal layer 116 is connected to a TDR measurement device 408 connected to trace 112 on signal layer #2, 116. The trace 112 starts under the chip package 402 in a BGA 404 and is not easily probable. By having the TDR measurement device 408 on the end of the trace at a probe point, the laser 122 is turned on until the TDR shows that the connection has been made, as illustrated in FIG. 4B. Note this situation can occur where the board is already populated and a configuration change is needed.

Referring now to FIG. 4B, there are shown time domain reflectometry (TDR) measurement plots generally designated by reference character 420 for the example structure 400 in accordance with a preferred embodiment. A first plot 422 illustrates the TDR plot before connection. A second plot 424 illustrates the TDR plot after connection has been made.

Figure 5A:
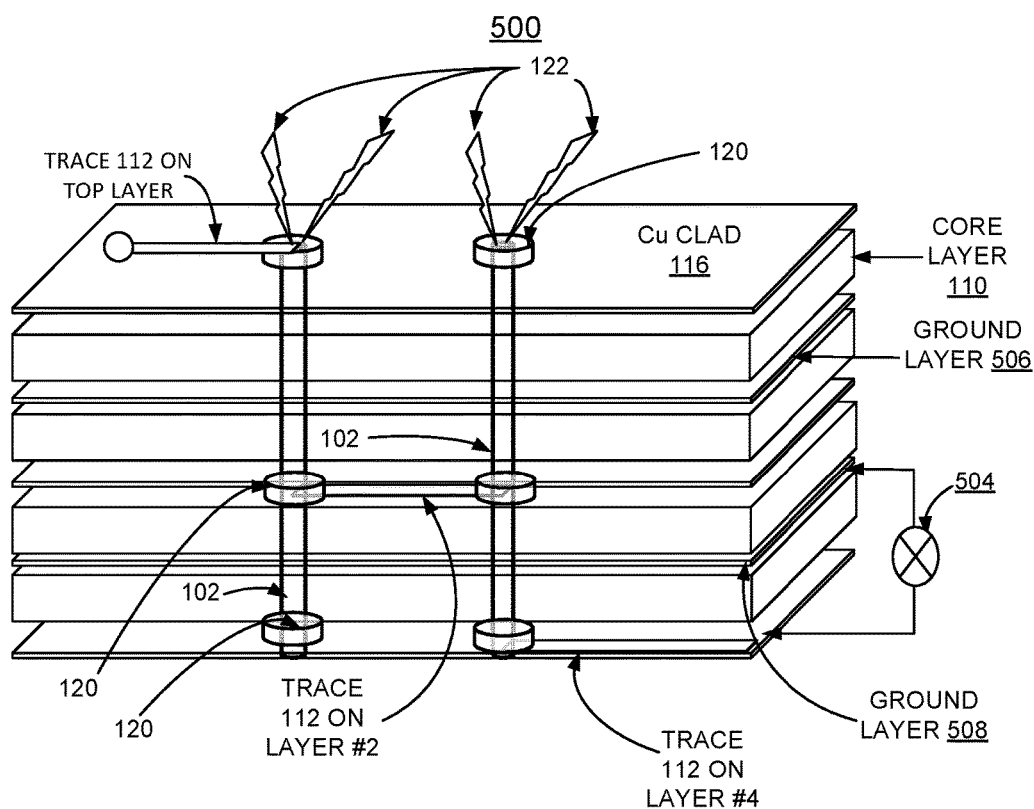
FIG. 5A illustrates another example structure for implementing enhanced stub-less via creation where time domain reflectometry (TDR) measurement device is used in accordance with a preferred embodiment.

Referring now to FIG. 5A, there is shown another example structure generally designated by reference character 500 for implementing enhanced stub-less via creation where time domain reflectometry (TDR) measurement device is used in accordance with a preferred embodiment. Structure 500 includes a trace 112 on signal layer #2, 116 with multiple vias 102 needs to be manufactured, with TDR measurement device 504, and ground layers, 506, 508. The via 102 transitioning from trace 112 on signal layer #4, 116 to trace 112 on signal layer #2, 116 is manufactured first. The via 102 is created, either suffering a stub between the top layer and trace 112 on signal layer #2, 116 or else, using a laser setup of focused/multi-beams 122 to minimize the stub. The TDR measurement device 504 is used to see the first connection made, as shown. The second via 102 is created, again monitoring the TDR response.

Figure 5B:
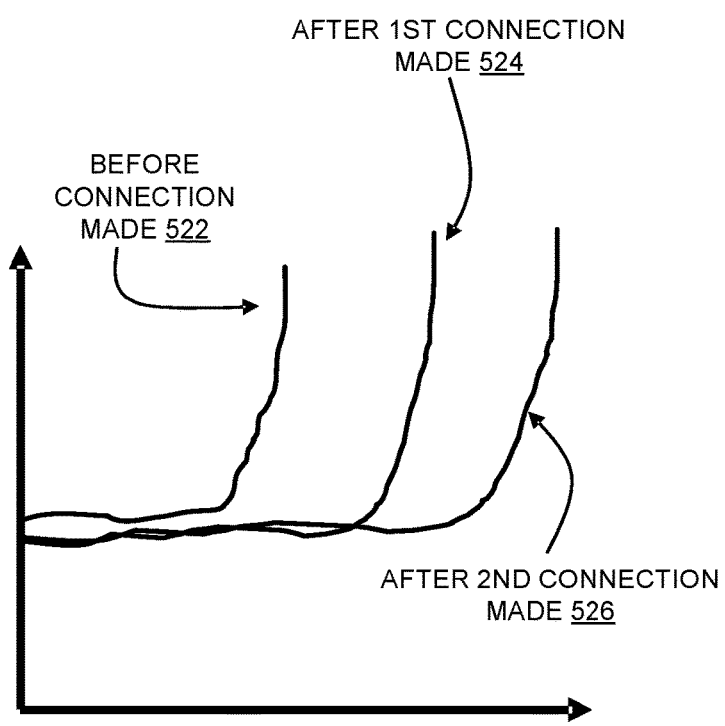
FIG. 5B illustrates time domain reflectometry (TDR) measurement plots for the example structure of FIG. 5A in accordance with a preferred embodiment.

Referring now to FIG. 5B, there are shown time domain reflectometry (TDR) measurement plots generally designated by reference character 520 for the example structure of FIG. 5A in accordance with a preferred embodiment. A first plot 522 illustrates the TDR plot before connection. A second plot 524 illustrates the TDR plot after a first connection has been made. A third plot 526 illustrates the TDR plot after a second connection has been made.

Referring now to FIG. 6, there is shown an example structure generally designated by reference character 600 for implementing a custom termination resistor with a differential pair in accordance with a preferred embodiment. Structure 600 includes a differential amplifier 602 with laser excitation used to create a precise termination resistor 604, for example, at a differential pair to prevent reflections. Assume that for a given laser energy fluence, the amount of laser energy delivered in a single pulse expressed in joules/$cm^2$, 100 pulses are needed to convert all of the spinel into conductive nuclei. This provides the user with control over the resistance of the resulting via and/or conductive track. Also to control the resistance 604 is to adjust the loading level of the spinel with-the greater the concentration of the spinel, the greater the number of nuclei per pulse, the lower the resistance in accordance with features of the invention.

Referring now to FIG. 7, there is shown another example structure generally designated by reference character 700 for implementing custom termination resistors created vertically and horizontally and at interior printed circuit board (PCB) levels or on transmission lines in accordance with a preferred embodiment. Structure 700 illustrates resistors 702, 704 created horizontally Rx 702 within a trace 112 on a top signal layer 116, and vertical Ry 704 including at interior levels using a singularly focused multi-beam array 122. Also resistors can be created, for example, on transmission lines as terminating resistors.

Referring now to FIG. 8, there is shown another example structure generally designated by reference character 800 for implementing custom options with conductive path creations in accordance with a preferred embodiment. Structure 800 illustrates enablement of an example application specific integrated circuit (ASIC) function 802. Structure 800 including ASIC function 802 includes a base function 804, an option A, 806, an option B, 808 an option C, 810. Laser excitation allows for a single ASIC 804 to be produced for multiple architectures, with initially non-conductive paths 812 shipped to customer (per order). Options A, 806, B, 808, C, 810 can be enabled via laser excitation to create a conductive path to each block, as shown with option A, 806 connected to the base function 804. The sectional improvement allows a single ASIC to operate in custom applications. The ASIC function 802 can be sold with only the base function 804 enabled. Upon request from the customer additional options can be enabled. A fully disconnected option would allow for increased power saving and limited leakage current as no conductive path would exist between I/Os and Vdd. Note that limited disconnection such as a grounded chip enable is still possible.

While the present invention has been described with reference to the details of the embodiments of the invention shown in the drawing, these details are not intended to limit the scope of the invention as claimed in the appended claim.

What is claimed is:

1. A method for implementing stub-less printed circuit board (PCB) vias and custom interconnect comprising:
   providing a printed circuit board (PCB); said printed circuit board (PCB) having a core layer formed of laser-excited conductive track nuclei and at least one signal trace on a signal layer;
   forming a stub-less PCB via extending within the printed circuit board (PCB) to terminate at one desired signal layer through laser-excitation; and
   forming a resistor vertically and a resistor horizontally in the printed circuit board (PCB).

2. The method as recited in claim 1 wherein forming stub-less printed PCB vias includes drilling at least one clearance hole into a conductive PCB layer.

3. The method as recited in claim 2 includes drilling at least one clearance hole into a PCB copper clad layer.

4. The method as recited in claim 2 includes energizing at least one laser excitation source directed to said least one clearance hole.

5. The method as recited in claim 4 includes maintaining at least one laser excitation source energized and directed to said least one clearance hole to terminate at said least one desired signal layer.

6. The method as recited in claim 4 includes providing a resistance measurement device for monitoring depth of the conductive tracks in the stub-less PCB vias to identify a predefined value being reached.

7. The method as recited in claim 6 wherein forming stub-less PCB vias extending within the printed circuit board (PCB) to terminate at least one desired signal layer through laser-excitation includes applying resistance measurement monitoring between each signal layer change.

8. The method as recited in claim 6 includes providing a resistance measurement device for monitoring resistance to another signal plane where signal continuity is not required.

9. The method as recited in claim 4 includes providing a time domain reflectometry (TDR) measurement device for monitoring a connection being made by the stub-less PCB via to the desired signal track.

10. The method as recited in claim 4 includes multiple stub-less vias being formed and providing a time domain reflectometry (TDR) measurement device for monitoring a connection being made by each of the stub-less PCB vias.

11. The method as recited in claim 1 wherein forming a resistor vertically and a resistor horizontally in the printed circuit board (PCB) includes creating the resistor vertically and the resistor horizontally in the printed circuit board at interior levels using a singularly focused multi-beam array.

12. The method as recited in claim 1 wherein eliminating via back-drilling enables improved yield and reliability of the PCB.

* * * * *